US010217679B2

(12) United States Patent
Huisstede et al.

(10) Patent No.: US 10,217,679 B2
(45) Date of Patent: Feb. 26, 2019

(54) METHOD FOR POSITIONING A CARRIER WITH ELECTRONIC COMPONENTS AND ELECTRONIC COMPONENT PRODUCED WITH SUCH METHOD

(71) Applicant: BESI NETHERLANDS B.V., Duiven (NL)

(72) Inventors: Jurgen Hendrikus Gerhardus Huisstede, Goor (NL); Mark Hermans, Geldermalsen (NL)

(73) Assignee: Besi Netherlands B.V., Duiven (NL)

( * ) Notice: Subject to any disclaimer, the term of this patent is extended or adjusted under 35 U.S.C. 154(b) by 70 days.

(21) Appl. No.: 15/027,712

(22) PCT Filed: Oct. 8, 2014

(86) PCT No.: PCT/NL2014/050702
§ 371 (c)(1),
(2) Date: Apr. 7, 2016

(87) PCT Pub. No.: WO2015/053628
PCT Pub. Date: Apr. 16, 2015

(65) Prior Publication Data
US 2016/0240445 A1 Aug. 18, 2016

(30) Foreign Application Priority Data
Oct. 8, 2013 (NL) .................................. 2011575

(51) Int. Cl.
*H01L 23/00* (2006.01)
*H01L 21/66* (2006.01)
(Continued)

(52) U.S. Cl.
CPC .......... *H01L 22/22* (2013.01); *H01L 21/4853* (2013.01); *H01L 21/78* (2013.01); *H01L 22/30* (2013.01); *H01L 23/544* (2013.01); *H01L 23/49816* (2013.01); *H01L 2223/5442* (2013.01); *H01L 2223/54426* (2013.01);
(Continued)

(58) Field of Classification Search
CPC ..... H01L 22/22; H01L 21/4853; H01L 21/78; H01L 22/30; H01L 23/544; H01L 23/49816
See application file for complete search history.

(56) References Cited

U.S. PATENT DOCUMENTS 6,003,753 A 12/1999 Hwang et al.
6,671,397 B1 12/2003 Mahon et al.
(Continued)

FOREIGN PATENT DOCUMENTS

EP 1259103 A1 11/2002
JP 2005032910 A 2/2005
(Continued)

*Primary Examiner* — Mounir Amer
*Assistant Examiner* — Alexander Belousov
(74) *Attorney, Agent, or Firm* — The Webb Law Firm

(57) ABSTRACT

The present invention relates to a method of processing a solder masked carrier with electronic components, comprising the detection of a carrier related reference and the detection of a solder mask dependent reference, which detected reference are used for processing the position of the solder mask on the carrier. The invention also relates to an electronic component as produced with such method.

11 Claims, 5 Drawing Sheets

(51) Int. Cl.
  *H01L 21/48* (2006.01)
  *H01L 23/544* (2006.01)
  *H01L 21/78* (2006.01)
  *H01L 23/498* (2006.01)

(52) U.S. Cl.
  CPC ............... *H01L 2223/54453* (2013.01); *H01L 2223/54486* (2013.01); *H01L 2224/03013* (2013.01); *H01L 2224/73253* (2013.01); *H01L 2924/0002* (2013.01)

(56) References Cited

U.S. PATENT DOCUMENTS

| | | | |
|---|---|---|---|
| 2002/0058396 A1* | 5/2002 | Roberts | H01L 23/544 |
| | | | 438/460 |
| 2003/0000738 A1 | 1/2003 | Rumsey et al. | |
| 2003/0015342 A1* | 1/2003 | Sakamoto | H01L 21/4846 |
| | | | 174/250 |
| 2005/0001299 A1 | 1/2005 | Ryu et al. | |
| 2006/0128040 A1* | 6/2006 | Chen | H05K 1/0269 |
| | | | 438/15 |

FOREIGN PATENT DOCUMENTS

| | | |
|---|---|---|
| JP | 2006261478 A | 9/2006 |
| TW | 200620504 A | 6/2006 |

\* cited by examiner

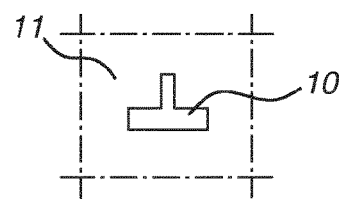
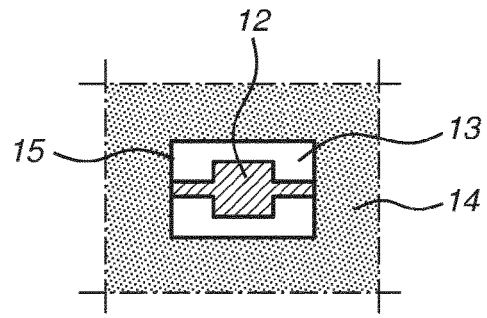
Fig. 2A       Fig. 2B
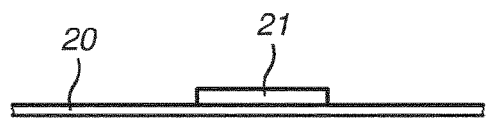
Fig. 3A
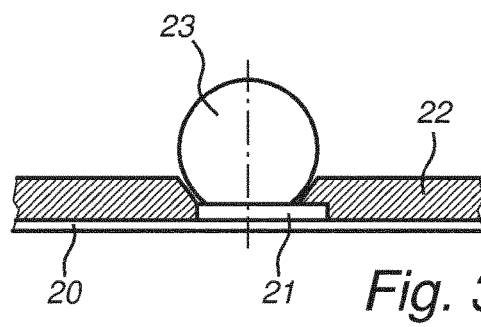
Fig. 3B
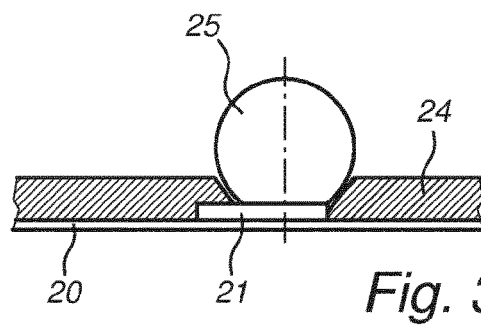
Fig. 3C State of the Art

METHOD FOR POSITIONING A CARRIER WITH ELECTRONIC COMPONENTS AND ELECTRONIC COMPONENT PRODUCED WITH SUCH METHOD

CROSS-REFERENCE TO RELATED APPLICATIONS

This application is the United States national phase of International Application No. PCT/NL2014/050702 filed Oct. 8, 2014, which claims priority to Dutch Application No. 2011575 filed Oct. 8, 2013, the disclosures of which are hereby incorporated in their entirety by reference.

BACKGROUND OF THE INVENTION

Field of the Invention

The invention relates to a method of processing a carrier with electronic components, comprising the method steps: detecting at least one carrier related reference; processing the at least one detected carrier related reference into a position of the carrier and processing the solder masked carrier with electronic components. The invention also relates to an electronic component produced with such a method.

Description of Related Art

The manufacturing electronic components, such as more particularly—but not exclusively—semiconductor products, usually takes place in larger quantities by making use of units of electronic components wherein the electronic components are integrated in/on larger component carriers. During the manufacturing electronic components frequently for functional reasons also a solder mask is applied to the carriers. After applying a solder mask normally contact elements like wires (or as an alternative small solder balls at BGA's) are attached to the electronic components (e.g. by "wire bounding" or "solder bathing") while the electronic components are still integrated by/on the carrier. The carrier, which can also be seen as plural electronic component unit, may subsequently be processed to split up the larger number of combined electronic components into smaller units of one or several individual electronic components (this process is also referred to as separation, singulation or individualisation) or to at least partially isolate the electronic components. Product examples are packages with a plurality of encapsulated electronic components placed on a carrier, and wafers consisting of a silicon carrier on which are arranged electronic components divided into smaller units. The isolation or separation of the electronic components can be realized by means of different types of processes, such as machining (e.g. sawing with blades, liquids or light). This process enables the production of large numbers of electronic components but due to, among others, the trend of miniaturisation of the electronic components demands toward the required process precision increase and thus the demand arises to higher precision processing.

The US patent application 2005/0001299 discloses a substrate for a semiconductor package and a wire bonding method using such semiconductor package. In an exemplary embodiment of the invention the wire bonding method not only calculates a changed wire bounding coordinate but also includes the steps of providing a substrate which includes one or more reference marks, imaging these reference marks and, calculating a solder mask shift. The calculated solder mask shift enables to calculate new wire bounding coordinates.

In order to meet the higher accuracy demands in the manufacturing of electronic components a first solution would be to increase the accuracy of existing process equipment but such is expensive. The present invention has for its object to however provide an alternative method of processing carriers with electronic components that enable to process the carriers with more accuracy.

SUMMARY OF THE INVENTION

The invention provides for this purpose a method of processing a solder masked carrier with electronic components, comprising the method steps: A) detecting at least one carrier related reference; B) processing the at least one detected carrier related reference into a position of the carrier; C) detecting a least one solder mask dependent reference; D) processing the at least one detected solder mask dependent reference into a position of the solder mask on the carrier; and E) processing the solder masked carrier with electronic components dependent on at least the position of the solder mask on the carrier, wherein the processing of the solder masked carrier with electronic components according step E) comprises the separation of the solder masked electronic components. A carrier related reference is also referred to in the art as a "fiducial" or a "fiducial point" and is used as a point of reference in X-Y directions for imaging systems. Common types of "fiducials" are graphical signs on a carrier (such as a BGA) and which is provided often tens of times on a single carrier. Likewise the solder mask references indicating the position of the solder mask can be named "fiducials". Examples of solder mask position related "fiducials" are openings in a solder mask providing a vision system access to the underlying pattern in combination with the solder mask opening boundaries which enables to link the position of the solder mask to the carrier. In practice the processing accuracy of the solder masked board (according step E) was dependent on the detected carrier related references (which references are often integrated placed with lining (wiring) on the board in combination with the outline of the carrier. The processing accuracy of the solder masked board is thus independent of the actual position of the solder mask applied on the board. This provides evident benefits during further processing of the electronic component, since the solder mask is now outlined with the environment, e.g. the printed circuit board, it has to cooperate with. One of the insights of the present invention is also that the solder mask position could also be important for accurate partial of complete separation of the electronic components (or groups of electronic components) of the solder masked board. The isolation/separation may according the present invention be optimised to use the accurate information obtained in earlier stages of the manufacturing process of the electronic components for a later stage (step) in the processing of the electronic components. In the prior art the acquired accurate position information by calculating a solder mask shift was only used for wire bounding as for that processes there is a direct link between the solder mask position and the locations where wires have to be bounded. The present invention however also uses the accurate position information of the solder mask shift for a subsequent production step in which strep position information acquired earlier in the process is normally lost and has to be generated again. Now in the present invention the solder mask shift information of the earlier stages of the production process is utilised again in a subsequent processing step without any requirement of maintaining a specific accuracy in the product handling in between the relevant production steps. So even if the positon of the electronic components before the separation step is partially or totally lost (and thus has to be at least partially generated again) still the generated information of the solder mask shift may be used to enhance the accuracy of the separation process. To use the high precision solder mask shift data in a later production stage that has from origin less requirements relating the accuracy than the earlier wire bounding step is the insight of the present invention. While in the process of successive production steps detailed information of the orientation of the product got lost now the high detailed orientation information of the solder mask on the carrier is re-used in a subsequent production step. The use of the solder mask position will thus lead to more accurate isolation/separation. In practise deviations of ±25 μm are detected in isolation/separation accuracy of semiconductor products which can substantially be limited to deviations of less than ±15 μm, less than ±10 μm or even less than ±5 μm.

According the present invention inaccuracies in the positioning of the solder mask to the carrier (or any carrier bound items like the electronic components and/or wiring on the carrier) are detected and as far as the influence the accuracy of the processing of the solder masked board can be compensated in the processing of the solder masked carrier.

An example of such wiring detection is the detection of "bus lines" on semiconductor carriers. These "bus lines" provide electronic connections between the semiconductors that should be severed in a later process. In case of inaccuracy in the positioning of these "bus lines" later isolation of the semiconductors could be frustrated leading to higher rejection levels. The inaccuracy of the solder mask positioning on the carrier (also referred to as solder mask shift) can according the present invention however be taken out of the processing accuracy of the solder masked board. Leading towards higher product quality and less rejections. This is a feed forward process to enhance the over all accuracy. A further advantage relates the possibility according the present invention to enhance the process accuracy by feed back correction on the solder mask applying process. In case of a returning solder mask shift the solder mask applying process can be corrected feed back providing more accurate subsequent products.

In an embodiment of the method according the invention the processing steps A) and C) are combined in a single detection step. E.g. when detecting non solder mask-covered parts of a reference ("fiducial") on the carrier after the solder mask has been applied on the carrier the position of the carrier (or carrier related elements like electronic components and/or wiring) can be determined in combination with the position of the solder mask. With such a combined measurement the solder mask shift can thus also be determined with only a single detection step. This further simplifies the method of processing a carrier with electronic components according the present invention.

The solder mask position directly affects the step of attaching contacts to the solder masked carrier as the position of the solder mask may often dictate the position of the contacts attached. An example is the attachment of contact balls (solder balls) as for instance is required for BGA's (Ball Grid Array boards) which may also be dictated by the solder mask position. A solder mask shift may thus lead to a ball shift. The option of measurement of ball position afterwards is of coarse also an option to enhance the processing accuracy but it is far more difficult to have an accurate visual ball position measurement (due to among others the 3D shape of the balls and the variations in shape and size of the individual balls) than an accurate visual solder mask position measurement.

The present invention also provides the option that the processing of the solder masked carrier with electronic components according step E) is steered dependent on the processed position of the solder mask on the carrier according step D). Such steering is to be understood as a feed forward steering in that in subsequent processes adaptations can be made on product level to compensate detected individual solder mask shifts. As a further option it is also possible that in subsequent manipulations during the processing of the solder masked carrier with electronic components according step E) new carrier and/or solder mask dependent references are detected.

As to enhance the detection quality of the solder mask shift during detection of a least one solder mask dependent reference the solder masked carrier may be lighted with co-axial light. In this respect "co-axial" is to be understood as parallel to the line of detection. With such co-axial lighting the solder mask (dependent on the solder mask properties) the detection feasibility increases.

The invention also provides an electronic component as produced with the method according the present invention and as clarified above.

BRIEF DESCRIPTION OF THE DRAWINGS

The present invention will be further elucidated on the basis of the non-limitative exemplary embodiments shown in the following figures. Herein shows:

FIGS. 2A and 2B top view on a detail of a carrier related reference and a solder mask dependent reference;

FIGS. 3A-3C side views, on a carrier with electronic components, once before a solder mask has been applied onto the carrier, and twice after solder mask have been applied as well as solder balls have been attached;

DETAILED DESCRIPTION OF THE PREFERRED EMBODIMENTS

Figure 1A:
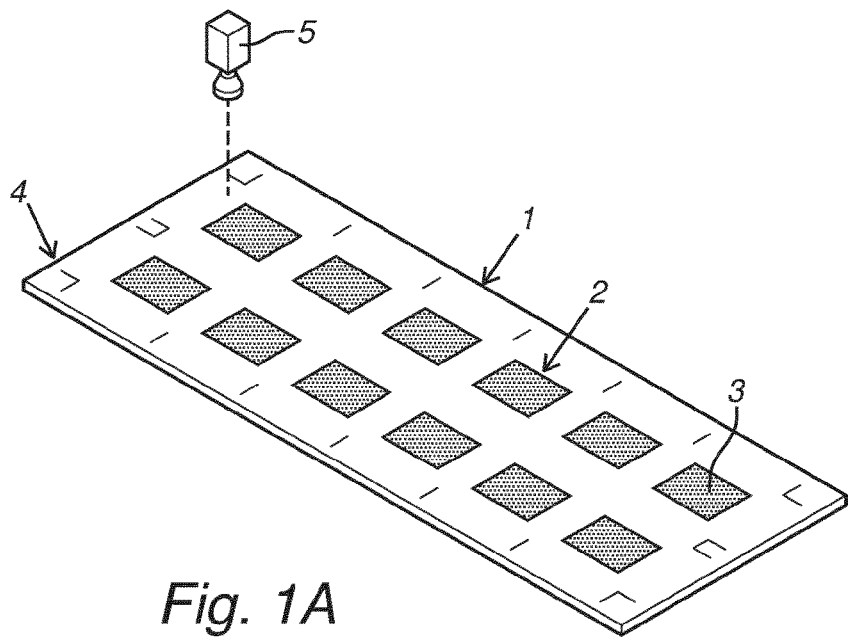
FIGS. 1A and 1B perspective views on carriers with electronic components before and after a solder mask has been applied onto the carrier.

FIG. 1A shows a perspective view on carrier 1 which is provided from a pattern 2 of wiring and contact pads (seen only in general and indicated by the grey area's 3). On the carrier 1 are also carrier related references 4 that are often affixed together with the wiring and contact pads. In FIG. 1A is also shown that a vision camera 5 detects the carrier related references 4.

Figure 1B:
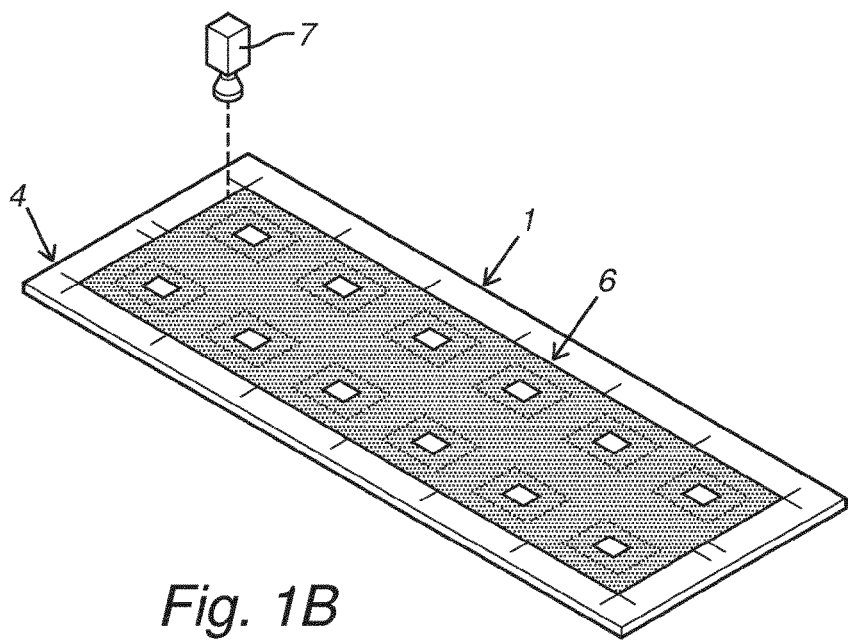

FIG. 1B shows a perspective view on the carrier 1 from FIG. 1A but now after a solder mask 6 has been added to the carrier 1 leaving locally only minor openings free to enable the placing of contacts as will be explained in connection to FIGS. 3A-3C and 4. In FIG. 1B again a vision camera 7 is shown now for the detection of solder mask dependent references as will be explained in connection to FIG. 2B. In stead of detecting the carrier related references 4 before the solder mask 6 has been added to the carrier 1 the present invention also covers the detection of the carrier related references 4 after the solder mask 6 has been added to the carrier 1. In practise this will even be more usual than the detecting the carrier related references 4 before the solder mask 6 has been added to the carrier 1.

FIG. 2A shows a top view on a carrier related reference 10 by the detection of which information gets available on the position of a carrier 11 on which the carrier related reference 10 is placed. FIG. 2B shows in top view a reference 12 which is placed on a carrier 13 but which is partially covered by a solder mask 14. In the solder mask 14 an opening 15 is left blank. When detecting the reference 12 in combination with detection of the location of the opening 15 relative to the reference 12 a solder mask dependent reference is obtained however as explained already in reference to FIGS. 1A and 1B it is also possible according the present invention to detect the carrier related reference 10 after the carrier 13 is partially covered by the solder mask 14.

FIG. 3A shows a side view on a carrier 20 with a contact pad 21. In FIG. 3B a solder mask 22 is placed on the carrier 20 and a (solder) ball 23 is subsequently placed on top of the contact pad 21. The same situation is shown in FIG. 3B where a solder mask 24 is placed on the same carrier 20 and also here a (solder) ball 25 is subsequently placed on top of the contact pad 21. The solder mask 22 in FIG. 3C is placed more to the left than the solder mask 24 in FIG. 3C. Dependent on the specific measurements the position of the solder mask 22, 24 may also influence the position of the solder balls 23, 25. The solder ball in FIG. 3B is placed more to the left than the solder ball 25 shown in FIG. 3C as the openings in the solder masks 22, 24 are such that they dictate the position of the balls. These FIGS. 3B and 3C show that knowledge of the relative position of the solder masks 22 and 24 provides information on the subsequent positioning of solder balls 23, 25.

Figure 4:
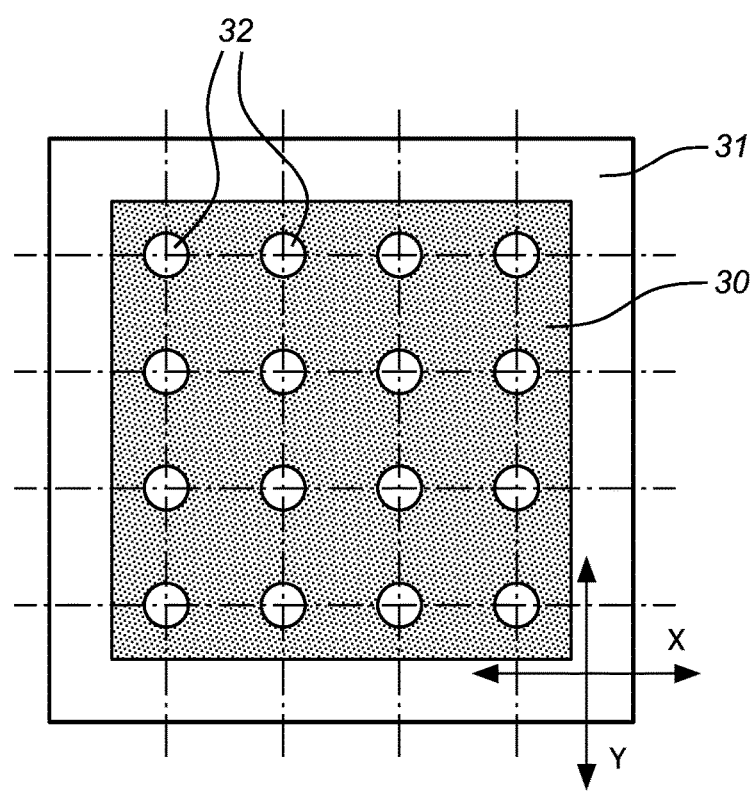
FIG. 4 a top view of a solder mask applied to a carrier with electronic components.

FIG. 4 shows a top view of a solder mask 30 applied to a carrier 31 with electronic components. The solder mask 30 is provided with a grid of apertures 32 that are open to accept solder balls (not shown here) to be place. The X/Y positioning of the solder mask 30 (shift in two directions) may thus be relevant for the positioning of solder balls still to be placed in the situation as shown in FIG. 4.

Figure 5A:
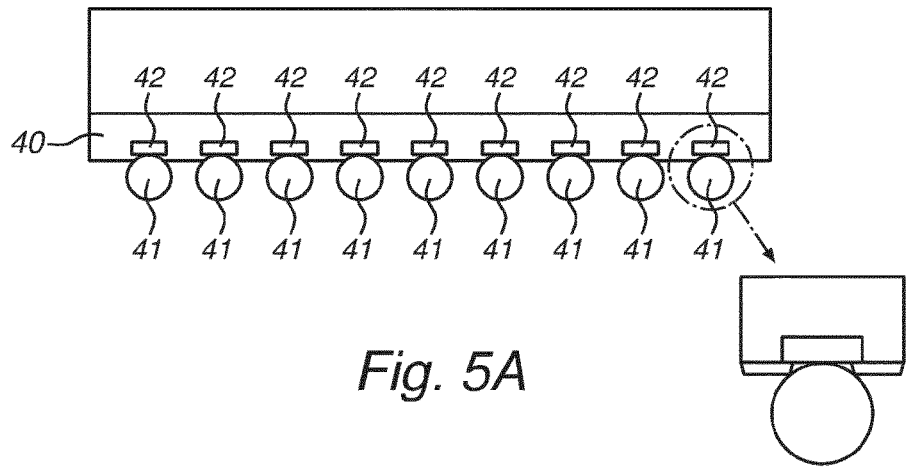
FIGS. 5A-5C show different mutual positions of a component and a PCB after separation but prior to further processing.
Figure 5B:
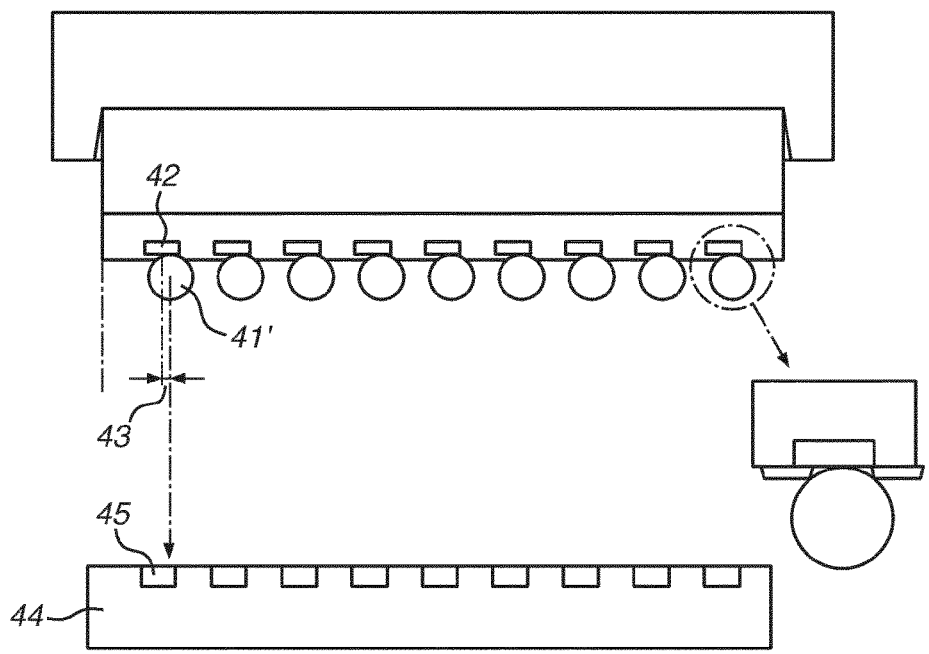
Figure 5C:
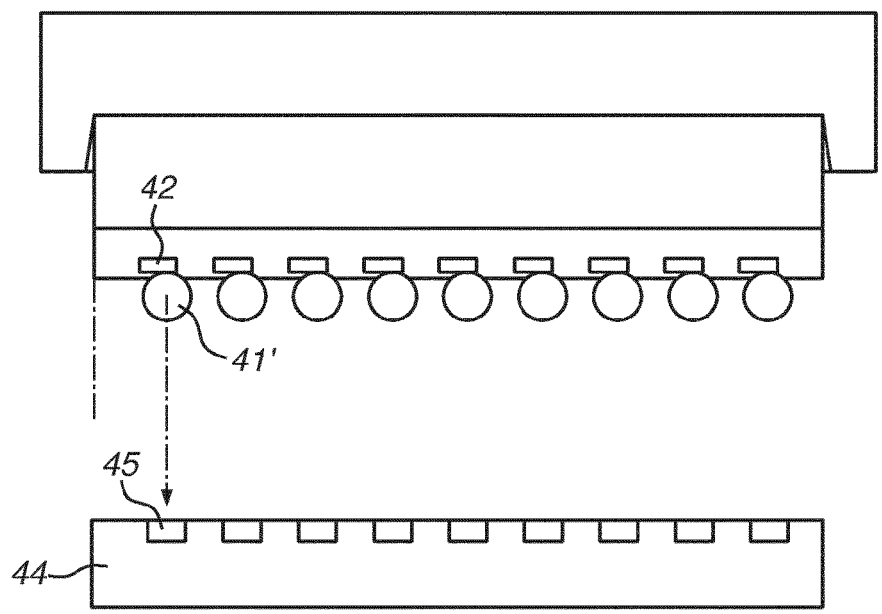

FIGS. 5A-5C show different mutual positions of a component and a PCB, prior to further processing. FIG. 5A shows a theoretical optimal position of a component 40 with solder balls 41, correctly positioned with respect to contact pads 42.

FIG. 5B shows a practical situation, wherein there is a difference 43 between the centre of the solder ball 41' and the contact pad 42. The difference 43 logically also occurs between the solder ball 41' and the contact pad 45 of a PCB 44, that is outlined with the component, without applying an anticipating correction according to the present invention.

FIG. 5C shows that, with the anticipation correction according to the present invention, solder ball 41' and PCB contact pad 45 are correctly outlined.

According the present invention inaccuracies in the positioning of the solder mask to the carrier (or any carrier bound items like the electronic components and/or wiring on the carrier) are detected and as far as the influence the accuracy of the processing of the solder masked board can be compensated in the processing of the solder masked carrier. An example of such wiring detection is the detection of "bus lines" on semiconductor carriers. These "bus lines" provide electronic connections between the semiconductors that should be severed in a later process. In case of inaccuracy in the positioning of these "bus lines" later isolation of the semiconductors could be frustrated leading to higher rejection levels. The inaccuracy of the solder mask positioning on the carrier (also referred to as solder mask shift) can according the present invention however be taken out of the processing accuracy of the solder masked board.

The invention claimed is:
1. A method of processing a solder masked carrier with electronic components, comprising the method steps:
   A) detecting at least one carrier related reference;
   B) processing the at least one detected carrier related reference into a position of the carrier;
   C) detecting at least one solder mask dependent reference; and
   D) processing the at least one detected solder mask dependent reference into a position of the solder mask on the carrier, thereby detecting inaccuracies in the positioning of the solder mask to the carrier;
   wherein the method further comprises the method step of
   E) processing the solder masked carrier with electronic components dependent on the position of the solder mask as such on the carrier, thereby compensating for the inaccuracies in the positioning of the solder mask to the carrier; and
   wherein the processing of the solder masked carrier with electronic components according step E) comprises the separation of the solder masked electronic components.

2. The method as claimed in claim 1, wherein the separation of the solder masked electronic components comprises the sawing of the solder masked carrier with electronic components.

3. The method as claimed in claim 1, wherein the processing steps A) and C) are combined in a single detection step.

4. The method as claimed in claim 1, wherein the solder mask is applied to the carrier before the processing steps A)-E) take place.

5. The method as claimed in claim 1, wherein a functional board part is detected as a carrier related reference.

6. The method as claimed in claim 1, wherein the method also comprises the method step of attaching contacts to the solder masked carrier.

7. The method as claimed in claim 1, wherein the processing of the solder masked carrier with electronic components according step E) involves the at least partial electronic isolation of the electronic components.

8. The method as claimed in claim 1, wherein the processing of the solder masked carrier with electronic components according step E) is steered dependent on the processed position of the solder mask on the carrier according step D).

9. The method as claimed in claim 1, wherein in subsequent manipulations of the processing of the solder masked carrier with electronic components according step E) new carrier and/or solder mask dependent references are detected.

10. The method as claimed in claim 1, wherein during detection of a least one solder mask dependent reference the solder masked carrier is lighted with co-axial light.

11. The method as claimed in claim 1, further including:
   F) detecting new carrier and/or solder mask dependent references in subsequent manipulations of the processing of the solder masked carrier with electronic components.

* * * * *